US006979406B2

(12) United States Patent
Song et al.

(10) Patent No.: US 6,979,406 B2
(45) Date of Patent: Dec. 27, 2005

(54) CANTILEVER-TYPE NEAR-FIELD PROBE FOR OPTICAL DATA STORAGE AND METHOD OF MANUFACTURING THE SAME

(75) Inventors: Kibong Song, Taejon (KR); Eunkyoung Kim, Taejon (KR); Sung Qyu Lee, Taejon (KR); Kang Ho Park, Taejon (KR); Jun Ho Kim, Kyungsangnam-Do Jinju (KR)

(73) Assignee: Electronics and Telecommunications Research Institute, Taejon (KR)

( * ) Notice: Subject to any disclaimer, the term of this patent is extended or adjusted under 35 U.S.C. 154(b) by 219 days.

(21) Appl. No.: 10/327,884

(22) Filed: Dec. 26, 2002

(65) Prior Publication Data
US 2005/0252882 A1   Nov. 17, 2005

(30) Foreign Application Priority Data
Oct. 22, 2002   (KR) ..................... 10-2002-0064662

(51) Int. Cl.[7] .............................................. H01L 21/00
(52) U.S. Cl. .............................. 216/11; 216/2; 216/24; 216/41; 216/47; 216/57; 438/717; 438/719
(58) Field of Search ........................ 216/2, 11, 24, 57, 216/41; 438/717, 719

(56) References Cited

U.S. PATENT DOCUMENTS

| 4,968,585 A  * | 11/1990 | Albrecht et al. ............ 430/320 |
| 6,246,054 B1 * | 6/2001  | Toda et al. ................. 250/306 |
| 6,370,306 B1 * | 4/2002  | Sato et al. .................. 385/129 |
| 6,768,095 B2 * | 7/2004  | Niwa et al. ................. 250/216 |
| 2002/0036753 A1 * | 3/2002 | Kasama et al. ............... 353/31 |

* cited by examiner

Primary Examiner—Shamim Ahmed
(74) Attorney, Agent, or Firm—Mayer, Brown, Rowe & Maw LLP

(57) ABSTRACT

Disclosed are a cantilever-type near-field probe capable of easily improving an optical throughput and being applied to a head of an optical data storage and a method of manufacturing the same. An oxide film is formed on a silicon substrate having dielectric films formed as a mask layer on upper and lower portions thereof, and a circular dielectric film formed on the upper mask layer and providing a function of a holder. A distal end of the probe has a parabolic structure by use of an effect of a bird's peak provided due to a difference of growth rate of the oxide film produced by the dielectric film, thereby forming the initial probe. After the dielectric film is removed from the initial probe, a bottom surface of the silicon substrate is removed, thereby providing the probe with the near-field aperture having a high throughput.

11 Claims, 7 Drawing Sheets

CANTILEVER-TYPE NEAR-FIELD PROBE FOR OPTICAL DATA STORAGE AND METHOD OF MANUFACTURING THE SAME

BACKGROUND OF THE INVENTION

1. Field of the Invention

The present invention relates to an optical data storage, and more particularly, to a cantilever-type near-field probe capable of easily improving an optical throughput and being applied to a head of an optical data storage and a method of manufacturing the same.

2. Background of the Related Art

Generally, it is widely known in that in order to store more optical data per unit area in an optical data storage a wavelength of a recording optical source has to be shortened and numerical apertures of a condensing lens have to be increased.

Although shortening the wavelength of recording optical source and increasing numerical apertures of condensing lens, since a next-generation data storage requiring a high density record has a limit of increasing the recording density due to diffraction of a light, there are proposed some alternative techniques such as a scanning probe recording (SPR) technique using a probe of atomic force microscope (AFM), a super resolution medium technique, a technique utilizing a near-field optical fiber probe overcoming the diffraction of the light, and so forth.

The near-field optical fiber probe has some drawbacks in that it is easily broken due to its mechanical weakness and it is difficult to arrange a number of probes at once. In addition, in case of the aperture of 100 nm, the throughput of light exited through the aperture is very small as a range of about $10^{-5}$ to about $10^{-7}$. Therefore, it is difficult to improve recording and processing speed of the optical data to such an extent that it is practically used.

In order to overcome the drawback of the conventional optical fiber probe, a new probe having several apertures has been developed through a common process of manufacturing a semiconductor device. However, since the throughput of light exited through the aperture is up to $10^{-5}$, like as the conventional optical fiber probe, there is necessity for increasing the throughput. Therefore, in order to increase the throughput of the aperture formed at the distal end of the probe, a method of exciting a plasmon mode and a method of minimizing the optical loss region generated from one wavelength dimension of the distal end of the probe have been proposed.

According to the method of exciting the plasmon mode, since an exciting efficiency of the plasmon mode is depended upon polarization and wavelength of an incident light, it is difficult to effectively excite the plasmon mode. In addition, there is another problem requiring an additional structure to excite the plasmon mode.

The method of minimizing the optical loss region is introduced by the conventional optical fiber probe, in which the probe is manufactured to have a structure of a large cone angle at the distal end thereof through a multi-stage wet etching process, a primary taper region of the probe is provided with a reflective film to reflect the incident light, a secondary taper region of the probe has a large cone angle consisting of the reflective film to maximally reduce the optical loss region, and a third taper region of the probe is to have a very small aperture of a probe shape, thereby providing the aperture of a high throughput.

However, the method of minimizing the optical loss region has drawbacks that the dimensions of the aperture depends upon the size of the primary taper region, and the aperture is manufactured through the multi-stage wet etching process, thereby complicating the manufacturing process.

SUMMARY OF THE INVENTION

Accordingly, the present invention is directed to a cantilever-type near-field probe and a method of manufacturing the same that substantially obviate one or more problems due to limitations and disadvantages of the related art.

An object of the present invention is to provide a cantilever-type near-field probe capable of easily improving an optical throughput and being applied to a head of an optical data storage and a method of manufacturing the same, in which an oxide film is formed on a silicon substrate having dielectric films formed as a mask layer on upper and lower portions thereof, and a circular dielectric film formed on the upper mask layer and providing a function of a holder, which a distal end of the probe has a parabolic structure by use of an effect of a bird's peak provided due to a difference of growth rate of the oxide film produced by the dielectric film, thereby forming the initial probe, and which after the dielectric film is removed from the initial probe, a bottom surface of the silicon substrate is removed, thereby providing the probe with the near-field aperture having a high throughput.

To achieve the object and other advantages, according to one aspect of the present invention, there is provide a cantilever-type near-field probe for a head of an optical data storage; the cantilever-type near-field probe comprising: a silicon substrate with a through-hole passing through upper and lower portions of a body; a dielectric film formed on a bottom portion of the silicon substrate as a mask layer; an oxide film deposited in a parabolic shape on the upper portion of the silicon substrate, and having an aperture formed in a vertex of the oxide film and communicating with the through-hole of the silicon substrate; and a metal film deposited on an upper portion of the oxide film, and having a near-field aperture communicating with the aperture of the oxide film and having a high throughput.

According to another aspect of the present invention, there is provided a method of manufacturing a cantilever-type near-field probe for a head of an optical data storage; the method comprising the steps of: forming a dielectric film on a bottom portion of a silicon substrate as a mask layer; forming a circular dielectric film on an upper portion of the dielectric film formed on the silicon substrate; dry-etching the dielectric film, which is exposed under the circular dielectric film, on the silicon substrate; wet-etching an exposed silicon substrate in such a way that a width of an interface between the circular dielectric film and the exposed silicon substrate has a predetermined value, to form an initial probe; depositing an oxide film of a predetermined thickness on the upper portion of the etched silicon substrate of the initial probe; removing the circular dielectric film after forming the oxide film; applying a passivation layer on the oxide film of the initial probe with the circular dielectric film removed; forming a passivation film pattern on a bottom surface of the initial probe with the passivation layer applied, and exposing the silicon; etching only the silicon on an exposed bottom of the initial probe; etching the passivation layer applied on an upper surface of the initial probe; and depositing a metal film of a predetermined thickness on an upper portion of the oxide film to provide a near-field aperture to the initial probe of which the passivation layer is removed to form an aperture.

It is to be understood that both the foregoing general description and the following detailed description of the present invention are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this application, illustrate embodiment(s) of the invention and together with the description serve to explain the principle of the invention. In the drawings.

DETAILED DESCRIPTION OF THE PREFERRED EMBODIMENTS

A preferred embodiment according to the present invention will now be explained with reference to the accompanying drawings.

Figure 1:
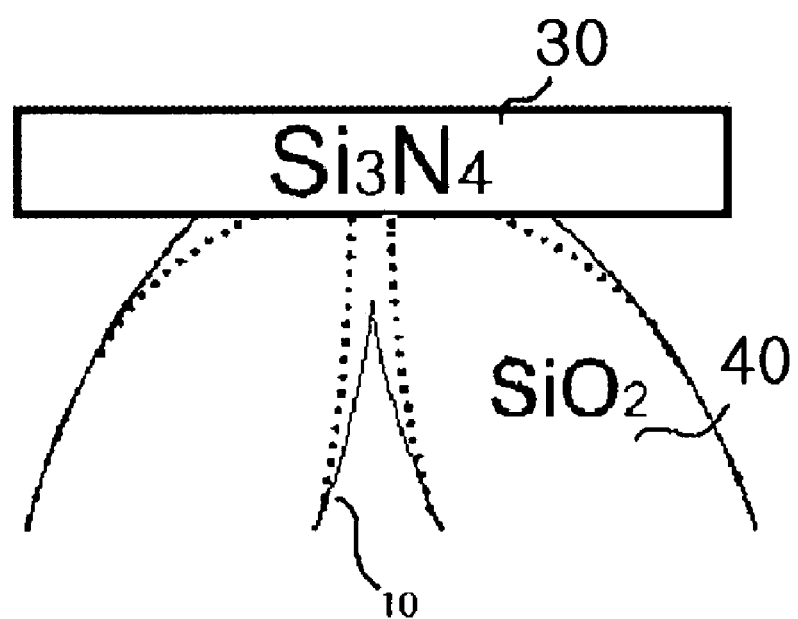
FIG. 1 is a schematic view showing a cantilever-type near-field probe according to the present invention, in which a distal end thereof has a parabolic structure.

Referring to FIG. 1, the structure of a cantilever-type near-field probe according to the present invention includes a silicon substrate 10 having silicon nitride (Si3N4) films of a dielectric film formed as a mask layer on upper and lower portions of the silicon substrate, and a circular silicon nitride (Si3N4) film 20 of a circular dielectric film formed on the upper mask layer and providing a function of a holder, and an initial probe, in which an effect of a bird's peak is provided due to a difference of growth rate of an oxide film produced by the circular silicon nitride (Si3N4) film 20 when a silicon oxide (SiO2) film 40 is formed on the silicon substrate 10, so that a distal end of the probe has a parabolic structure to finally provide an aperture.

Specifically, the cantilever-type near-field probe according to the present invention includes the silicon substrate 10 with a through-hole 11 passing through the upper and lower portions of a body, the silicon nitride film 20 of a dielectric film formed as the mask layer on a bottom portion of the silicon substrate 10 in a thickness of 300 nm, the silicon oxide film 40 deposited in a parabolic shape on the upper portion of the silicon substrate 10 in a thickness of 650 nm, with the aperture 41 formed in a vertex of the silicon oxide film 40 and communicating with the through-hole 11, and an aluminum (Al) metal film 70 deposited on an upper portion of the silicon oxide film 40 in a thickness of 100 nm and having a near-field aperture 71 communicating with the aperture 41 of the silicon oxide film 40, the near-field aperture 71 having a high throughput.

The structure of the cantilever-type near-field probe according to the present invention is manufactured by a following method.

Figure 2A:
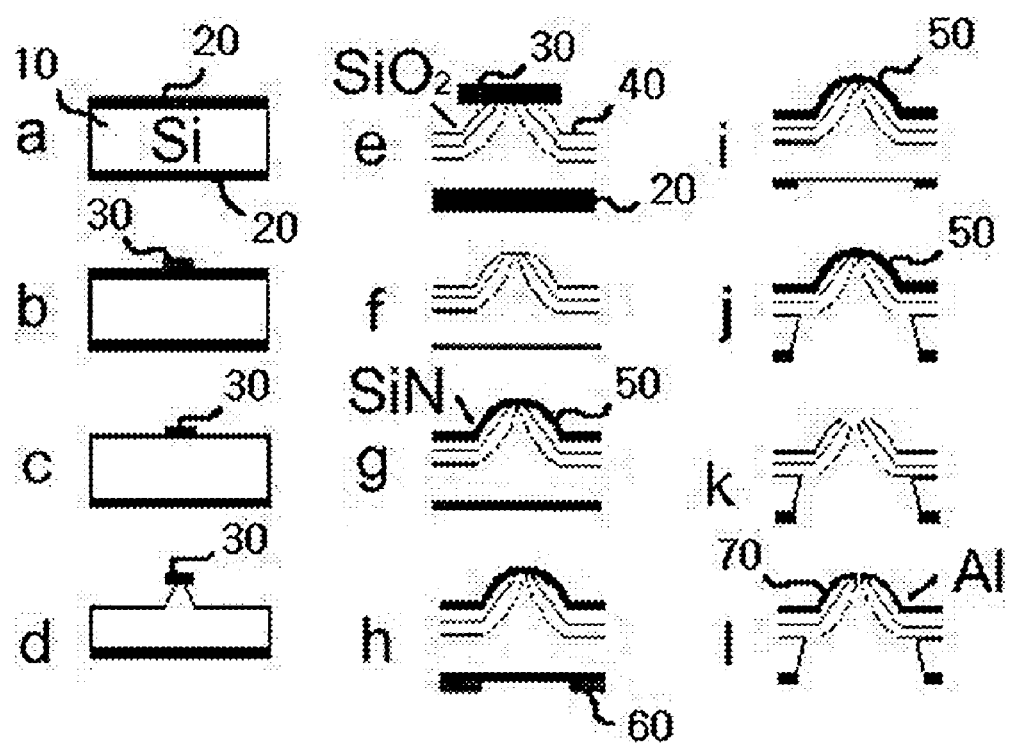
FIG. 2a is a flowchart showing a process of manufacturing a cantilever-type near-field probe according to the present invention, which may be applied to a head of an optical data storage.
Figure 2B:
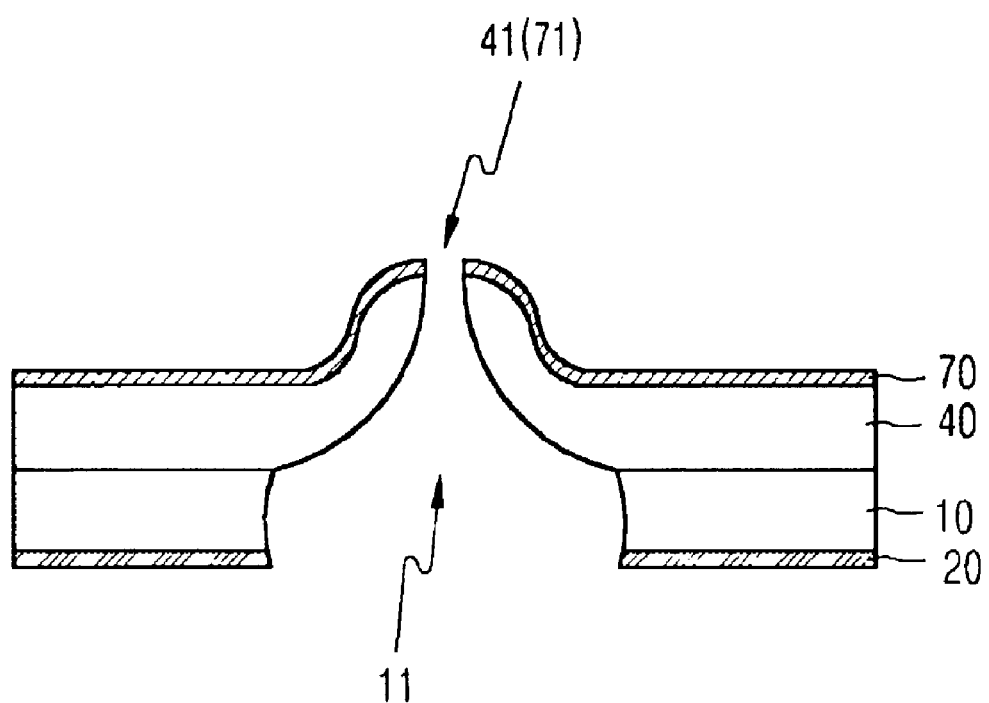
FIG. 2b is a schematic view showing a structure of a cantilever-type near-field probe according to the present invention, which may be applied to a head of an optical data storage.

Referring to FIG. 2a, the silicon nitride ($Si_3N_4$) films 20 of a dielectric film are formed as the mask layer on the upper and lower portions of the silicon substrate 10 in a thickness of about 300 nm through a low pressure chemical vapor deposition (LPCVD) (step a).

In order to form the initial probe structure, a circular silicon nitride ($Si_3N_4$) film 30 of a circular dielectric film having a diameter of about 30 um is formed on the silicon nitride film 20 formed on the silicon substrate 10 through a photolithography process (step b).

In order to further form the initial probe structure, after the silicon nitride film 20 exposed at the lower portion of the circular silicon nitride film 30 is dry-etched by use of $CF_4/Ar$ in a reactive ion etcher (step c), the exposed silicon substrate 10 is wet-etched by means of an isotropic etchant such that an interface between the circular silicon nitride film 30 and the exposed silicon substrate 10 has a width of about 650 nm (step d).

At that time, the dimension of the circular silicon nitride film 30 existed on the upper portion of the initial probe affects a height of the cantilever-type near-field probe, and a shape of near-field apertures with different structure may be formed depending upon the shape thereof. At performing the wet-etching, preferably, the interface between the circular silicon nitride film 30 and the exposed silicon substrate 10 has a width of up to 1 micron, the width determining the thickness of the oxide film and the dimension of aperture.

When the initial probe is manufactured, after the silicon oxide film 40 having a thickness of about 650 nm is deposited on the upper portion of the etched silicon substrate 10 of the initial probe at an oxidizing temperature of 925° C. (step e), the circular silicon nitride film 30 is selectively removed in hot phosphoric acid ($H_3PO_4$) solution of about 150° C. (step f).

The initial probe with circular silicon nitride film 30 removed is applied with a passivation layer so as to prevent the initial probe from being damaged by a next process. Preferably, the passivation layer includes a silicon nitride (SiN) film 50 effectively resisting an anisotropic silicon etchant such as KOH. In practice, according to the embodiment of the present invention, the silicon nitride film 50 of about 30 nm is deposited to prevent the probe of the oxide film (step g).

When the initial probe is applied with the silicon nitride film 50, the bottom surface of the silicon substrate 10 of the initial probe has to be removed so as to form the near-field aperture on the applied initial probe. First of all, after a silicon nitride (SiN) film pattern 60 is formed on the bottom of the substrate (step h), and the silicon is exposed (step i), only the silicon of the exposed bottom of the initial probe is selectively etched in the KOH solution at about 80° C. during about 4 hours so as to completely remove the silicon corresponding to the bottom of the substrate (step j). The silicon nitride film 50 of about 300 nm applied on the upper surface of the initial probe is etched by means of the $CF_4/Ar$ plasma during about 20 minutes (step k).

With the above-mentioned processes, the probe with the aperture 41 of a high throughput is manufactured. If the aluminum-metal film 70 is deposited in a thickness of 100 nm so as to provide the near-field aperture 71, thereby finally completing the probe structure according to the present invention (step 1).

Figure 3:
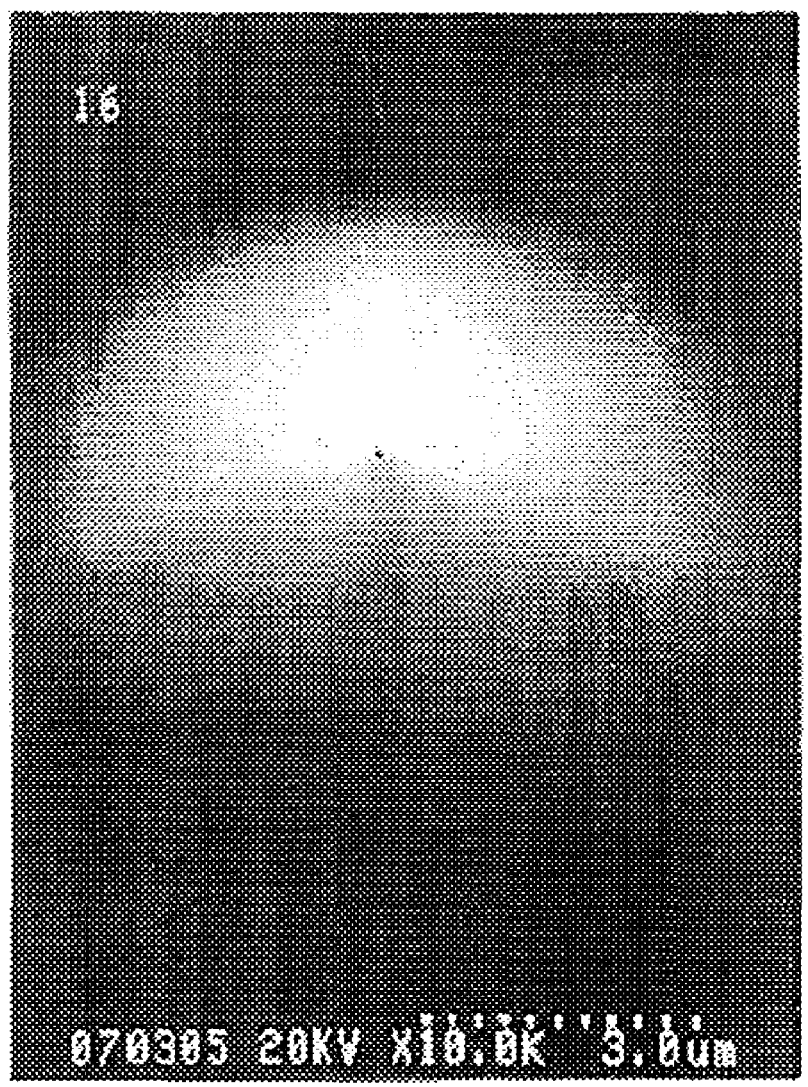
FIG. 3 is a photographic of a cantilever-type near-field probe according to the present invention, taken under SEM.
Figure 4:
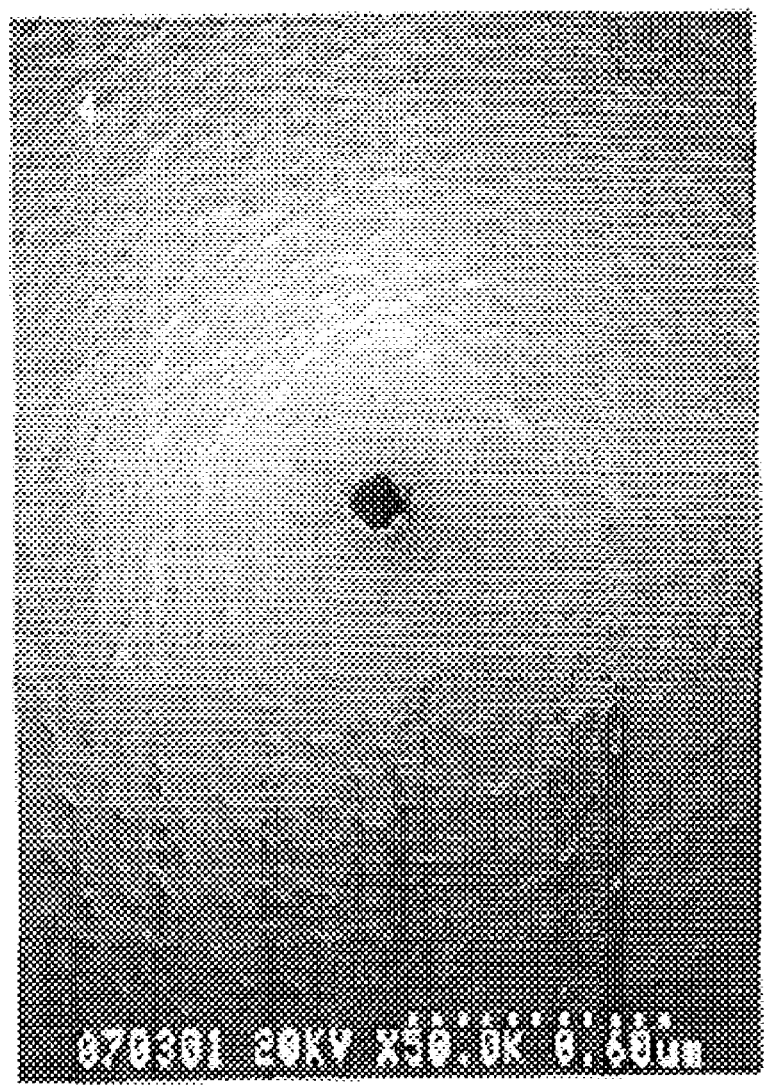
FIG. 4 is an enlarged photographic of an aperture formed in a cantilever-type near-field probe according to the present invention.

FIG. 3 is a photographic of the cantilever-type near-field probe according to the present invention manufactured by the above method, taken under scanning electron microscope (SEM), and FIG. 4 is an enlarged photographic of the near-field aperture (about 90 nm).

Figure 5:
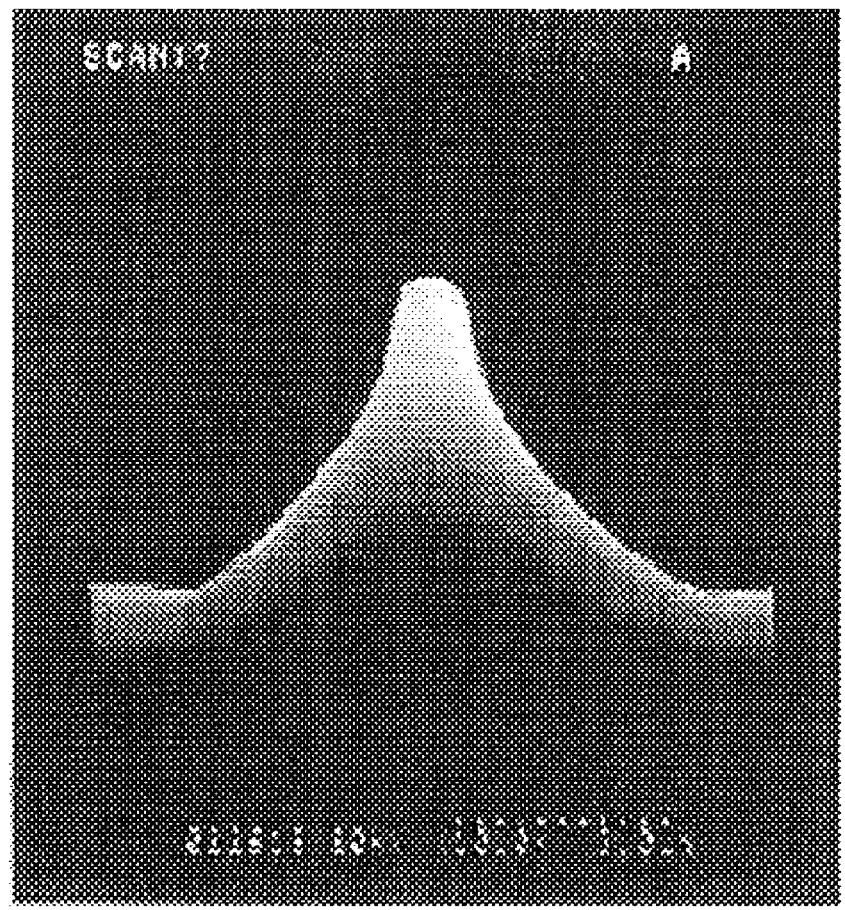
FIG. 5 is a photographic showing one-dimensional parabolic structure of a cantilever-type near-field probe according to the present invention.
Figure 6:
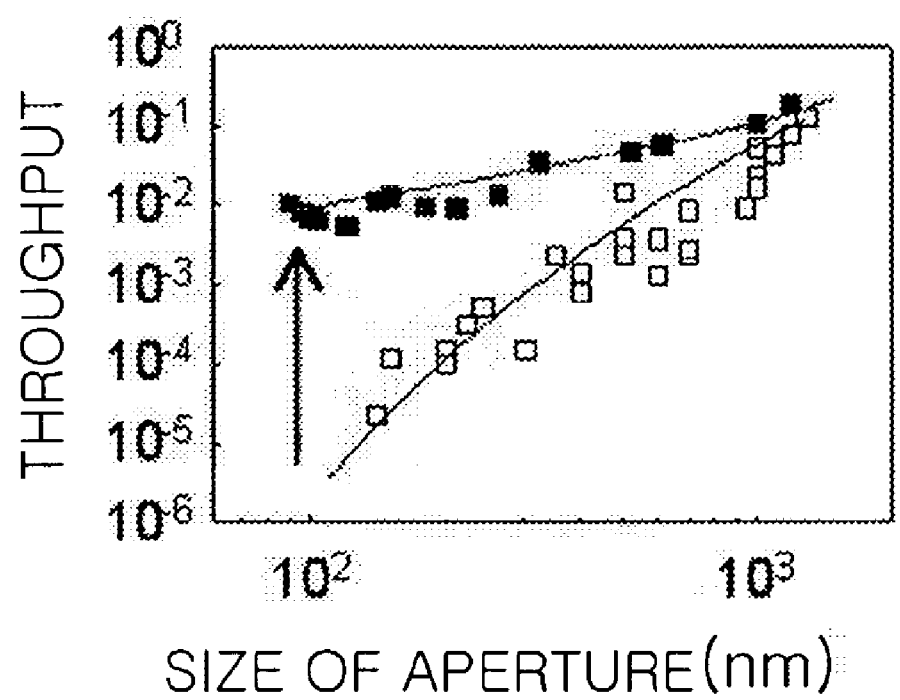
FIG. 6 is a graph showing throughputs of a cantilever-type near-field probe according to the present invention according to size of an aperture.

For reference, according to the cantilever-type near-field probe according to the present invention, it would be appreciated by those skilled in the art that the distal end of the probe has a parabolic structure of a large cone angle, as shown in FIG. 5. FIG. 6 shows compared results between the cantilever-type near-field probe of the present invention and the conventional optical fiber probe in terms of the optical throughput according to sizes (nm) of the aperture. It would be appreciated by those skilled in the art that the throughput of the cantilever-type near-field probe of the present invention is 1,000 times over that of the conventional optical fiber probe represented by an inclined side such as pyramid, the throughputs measured on the basic dimension (100 nm) of the aperture.

With the above description of the present invention, the oxide film is formed on the silicon substrate having the dielectric films formed as a mask layer on the upper and lower portions thereof, and the circular dielectric film formed on the upper mask layer and providing a function of the holder. At that time, the distal end of the probe has the parabolic structure by use of the effect of the bird's peak provided due to the difference of growth rate of the oxide film produced by the dielectric film, thereby forming the initial probe. After the dielectric film is removed from the initial probe, the bottom surface of the silicon substrate is removed, thereby providing the probe with the near-field aperture having a high throughput. By applying the present invention to the next-generation high density optical data storage, the optical loss region can be possibly shortened, and the optical throughput of the probe required for the record and reproduction of the optical data is increased several thousands time over that of the conventional optical fiber probe.

In practice, if some near-field probes of the present invention are arranged in the near-field head, the optical data may be recorded or reproduced very quickly in a high density. At that time, the recording density may be several hundreds Gbits/inch$^2$ in case of the aperture of up to 50 nm, thereby overcoming the limit of the data storing capacity of the optical data storage using the common optical fiber probe.

In addition, the probe with the near-field aperture of high throughput according to the present invention may be employed in a physical property analyzer, as well as the head of the high density optical data storage.

The forgoing embodiments are merely exemplary and are not to be construed as limiting the present invention. The present teachings can be readily applied to other types of apparatuses. The description of the present invention is intended to be illustrative, and not to limit the scope of the claims. Many alternatives, modifications, and variations will be apparent to those skilled in the art.

What is claimed is:

1. A method of manufacturing a cantilever-type near-field probe for a head of an optical data storage; the method comprising:

forming a first dielectric film on a bottom portion of a silicon substrate as a mask layer;

forming a second dielectric film on a top portion of a silicon substrate as a mask layer:

forming a circular dielectric film on a portion of the second dielectric film formed on the silicon substrate;

dry-etching the second dielectric film, which is exposed under the circular dielectric film, on the silicon substrate;

wet-etching an exposed silicon substrate in such a way that a width of an interface between the circular dielectric film and the exposed silicon substrate has a predetermined value, to form an initial probe;

depositing an oxide film of a predetermined thickness on the upper portion of the etched silicon substrate of the initial probe;

removing the circular dielectric film after forming the oxide film;

applying a passivation layer on the oxide film of the initial probe with the circular dielectric film removed;

forming a passivation film pattern on a bottom surface of the initial probe with the passivation layer applied, and exposing the silicon;

etching only the silicon on an exposed bottom of the initial probe;

etching the passivation layer applied on an upper surface of the initial probe to form an aperture; and depositing a metal film of a predetermined thickness on an upper portion of the oxide film to provide a near-field aperture to the initial probe.

2. The method as claimed in claim 1, wherein a silicon nitride film having a thickness of 300 nm is formed on upper and lower portions of the silicon substrate as a mask through LPCVD.

3. The method as claimed in claim 2, wherein a circular silicon nitride film having a diameter of 10 um is formed on the silicon nitride film formed on the silicon substrate.

4. The method as claimed in claim 3, wherein the silicon nitride film exposed at a lower portion of the circular silicon nitride film is dry-etched by use of CF4/Ar plasma in a reactive ion etcher.

5. The method as claimed in claim 4, wherein the exposed silicon substrate is wet-etched by means of an isotropic etchant such that an interface between the circular silicon nitride film and the exposed silicon substrate has a width of 650 nm.

6. The method as claimed in claim 5, wherein after the silicon oxide film having a thickness of 650 nm is deposited on an upper portion of the etched silicon substrate of the initial probe at an oxidizing temperature of 925° C., the circular silicon nitride film is removed in hot phosphoric acid solution of 150° C.

7. The method as claimed in claim 6, wherein a nitride film of 300 nm is deposited on the silicon oxide film of the initial probe.

8. The method as claimed in claim 7, wherein the bottom surface of the initial probe with the passivation layer applied is formed with a nitride film pattern to expose the silicon.

9. The method as claimed in claim 8, wherein the silicon of the exposed bottom of the initial probe is etched in a KOH solution at 80° C. during 4 hours.

10. The method as claimed in claim 7, wherein the nitride film of 300 nm applied on the upper surface of the initial probe is etched by means of the CF4/Ar plasma during about 20 minutes.

11. The method as claimed in claim 10, wherein in the initial probe with the passivation layer removed and an aperture formed, an aluminum metal film is deposited in a thickness of 100 nm to provide a near-field aperture having a high throughput.

* * * * *